United States Patent
Kondo et al.

(10) Patent No.: US 10,361,061 B2
(45) Date of Patent: Jul. 23, 2019

(54) ELECTRON MICROSCOPE AND IMAGE ACQUISITION METHOD

(71) Applicant: JEOL Ltd., Tokyo (JP)

(72) Inventors: Yukihito Kondo, Tokyo (JP); Ryusuke Sagawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/620,144

(22) Filed: Jun. 12, 2017

(65) Prior Publication Data
US 2018/0130634 A1 May 10, 2018

(30) Foreign Application Priority Data
Jun. 14, 2016 (JP) .................................. 2016-118163

(51) Int. Cl.
*H01J 37/22* (2006.01)
*H01J 37/09* (2006.01)
(Continued)

(52) U.S. Cl.
CPC ............ *H01J 37/22* (2013.01); *H01J 37/045* (2013.01); *H01J 37/09* (2013.01); *H01J 37/1474* (2013.01); *H01J 37/244* (2013.01); *H01J 37/28* (2013.01); *H01J 2237/024* (2013.01); *H01J 2237/0435* (2013.01); *H01J 2237/0453* (2013.01); *H01J 2237/2443* (2013.01); *H01J 2237/2446* (2013.01); *H01J 2237/2449* (2013.01); *H01J 2237/24475* (2013.01);
(Continued)

(58) Field of Classification Search
CPC .......... H01J 37/22; H01J 37/045; H01J 37/09; H01J 37/28; H01J 37/1474; H01J 2237/2803; H01J 2237/28; H01J 2237/024; H01J 2237/2802
USPC .................................................. 250/310, 311
See application file for complete search history.

(56) References Cited

U.S. PATENT DOCUMENTS 4,514,629 A 4/1985 Smith et al.
5,466,549 A * 11/1995 Yamada .............. H01J 37/3045
250/492.3
(Continued)

FOREIGN PATENT DOCUMENTS

JP 201222971 A 2/2012

OTHER PUBLICATIONS

European Search Report for EP 17175742.0.

*Primary Examiner* — David A Vanore
(74) *Attorney, Agent, or Firm* — The Webb Law Firm

(57) ABSTRACT

There is provided an electron microscope capable of recording images in a shorter time. The electron microscope (100) includes: an illumination system (4) for illuminating a sample (S) with an electron beam; an imaging system (6) for focusing electrons transmitted through the sample (S); an electron deflector (24) for deflecting the electrons transmitted through the sample (S); an imager (28) having a photosensitive surface (29) for detecting the electrons transmitted through the sample (S), the imager (28) being operative to record focused images formed by the electrons transmitted through the sample (S); and a controller (30) for controlling the electron deflector (24) such that an active electron incident region (2) of the photosensitive surface (29) currently hit by the beam is varied in response to variations in illumination conditions of the illumination system (4).

7 Claims, 18 Drawing Sheets

(51) Int. Cl.
  *H01J 37/04* (2006.01)
  *H01J 37/147* (2006.01)
  *H01J 37/28* (2006.01)
  *H01J 37/244* (2006.01)
(52) U.S. Cl.
  CPC ... *H01J 2237/28* (2013.01); *H01J 2237/2802* (2013.01); *H01J 2237/2803* (2013.01)

(56) References Cited

U.S. PATENT DOCUMENTS

| | | | | |
|---|---|---|---|---|
| 6,429,441 B1* | 8/2002 | Nakasuji | ............... | B82Y 10/00 250/397 |
| 6,646,262 B1* | 11/2003 | Todokoro | ............... | H01J 37/244 850/9 |
| 6,841,775 B2* | 1/2005 | Kondo | ............... | H01J 37/22 250/310 |
| 9,048,060 B2* | 6/2015 | Kieft | ............... | H01J 37/28 |
| 9,576,772 B1* | 2/2017 | Arjavac | ............... | H01J 37/28 |
| 2003/0116717 A1 | 6/2003 | Knippelmeyer | | |
| 2004/0000641 A1* | 1/2004 | Taniguchi | ............... | G01N 23/02 250/311 |
| 2006/0038125 A1* | 2/2006 | Tsuneta | ............... | G01N 23/22 250/310 |
| 2006/0124850 A1* | 6/2006 | Matsumoto | ............... | H01J 37/023 250/310 |
| 2008/0011949 A1* | 1/2008 | Sannomiya | ............... | H01J 37/153 250/311 |
| 2009/0224169 A1* | 9/2009 | Sawada | ............... | H01J 37/153 250/396 R |
| 2009/0302218 A1* | 12/2009 | Suhara | ............... | G03G 15/043 250/310 |
| 2011/0049363 A1 | 3/2011 | Koch | | |
| 2011/0188734 A1* | 8/2011 | Tsuchiya | ............... | G06T 7/0002 382/149 |
| 2011/0192976 A1* | 8/2011 | Own | ............... | H01J 37/153 250/311 |
| 2011/0278451 A1* | 11/2011 | Tiemeijer | ............... | H01J 37/05 250/307 |
| 2012/0049060 A1* | 3/2012 | Luecken | ............... | H01J 37/05 250/305 |
| 2012/0104253 A1* | 5/2012 | Tsuneta | ............... | H01J 37/20 250/307 |
| 2012/0287258 A1* | 11/2012 | Tsuneta | ............... | H01J 37/265 348/80 |
| 2012/0292504 A1* | 11/2012 | Nojima | ............... | G01N 23/2055 250/307 |
| 2013/0256531 A1* | 10/2013 | Yoshida | ............... | H01J 37/153 250/307 |
| 2013/0292566 A1* | 11/2013 | Benner | ............... | H01J 37/244 250/307 |
| 2013/0313432 A1* | 11/2013 | Tanigaki | ............... | H01J 37/295 250/311 |
| 2014/0117232 A1* | 5/2014 | Shachal | ............... | H01J 37/28 250/307 |
| 2015/0179394 A1* | 6/2015 | Saito | ............... | H01J 37/09 250/310 |
| 2015/0243474 A1* | 8/2015 | Lazic | ............... | H01J 37/244 250/307 |
| 2015/0255247 A1* | 9/2015 | Murakami | ............... | H01J 37/26 250/307 |
| 2016/0020066 A1* | 1/2016 | Morishita | ............... | H01J 37/222 702/151 |
| 2016/0079031 A1* | 3/2016 | Aoyama | ............... | G01N 23/2252 348/80 |
| 2016/0086762 A1* | 3/2016 | de Jong | ............... | H01J 37/05 250/305 |
| 2016/0118219 A1 | 4/2016 | Potocek et al. | | |
| 2016/0276130 A1* | 9/2016 | Mele | ............... | H04N 5/32 |
| 2016/0307729 A1* | 10/2016 | Lazic | ............... | H01J 37/222 |
| 2017/0018394 A1* | 1/2017 | Sohda | ............... | H01J 37/05 |
| 2017/0025248 A1* | 1/2017 | Shibata | ............... | H01J 37/226 |
| 2017/0047210 A1* | 2/2017 | Schwieters | ............... | H01J 49/025 |
| 2017/0125210 A1* | 5/2017 | Henstra | ............... | H01J 37/05 |
| 2018/0158646 A1* | 6/2018 | Nakamura | ............... | H01J 37/244 |

\* cited by examiner

ELECTRON MICROSCOPE AND IMAGE ACQUISITION METHOD

BACKGROUND OF THE INVENTION

Field of the Invention

The present invention relates to an electron microscope and an image acquisition method.

Description of Related Art

A scanning transmission electron microscope (STEM) is an instrument for obtaining a scanning transmission electron microscope (STEM) image by scanning a focused electron beam (electron probe) over a sample and detecting electrons transmitted through the sample (see, for example, JP-A-2012-22971).

One proposed measurement method using a scanning transmission electron microscope consists of scanning a conically focused electron beam over a sample, recording a convergent beam electron diffraction pattern for each pixel by an imager in synchronism with the scanning, and obtaining plural convergent beam electron diffraction patterns having a one-to-one correspondence with positions on the sample.

In order to achieve this measurement method, however, plural convergent beam electron diffraction patterns must be recorded in synchronism with the scanning of the electron beam. This needs an imager which records images (convergent beam electron diffraction patterns) at high speed. If the image recording time is lengthened, the instrument will be more affected by external disturbances and sample drifts due to temperature variations. Therefore, it is desired to shorten the image recording time as much as possible.

SUMMARY OF THE INVENTION

The present invention has been made in view of the foregoing problem. One object associated with some aspects of the present invention is to provide an electron microscope capable of recording images in a shorter time. Another object associated with some aspects of the invention is to provide an image acquisition method capable of recording images in a shorter time.

(1) An electron microscope associated with the present invention includes: an illumination system for illuminating a sample with an electron beam; an imaging system for focusing electrons transmitted through the sample; an electron deflector for deflecting the electrons transmitted through the sample; an imager which has a photosensitive surface for detecting the electrons transmitted through the sample and which records focused images formed by the electrons transmitted through the sample; and a controller for controlling the electron deflector such that an active electron incident region of the photosensitive surface currently hit by the beam is varied in response to variations in illumination conditions of the illumination system.

In this electron microscope, plural images obtained in response to variations in the illumination conditions can be recorded as one image or recorded on one image by the imager. Therefore, the recording time can be shortened as compared to the case where an image is recorded whenever the illumination conditions are varied, for the following reason. Whenever the illumination conditions are varied and an image is obtained, there is no need to read out an image from the imager. Rather, plural images can be read out from the imager at a time.

(2) In one feature of the electron microscope of the invention of (1) above, the illumination system may include a positional scanner for scanning the position on the sample hit by the impinging electron beam. The variations in the illumination conditions may be variations in the hit position.

In this electron microscope, plural images which have a one-to-one correspondence with positions on the sample can be recorded as one image in the imager. Therefore, the recording time can be shortened as compared with the case where an image is recorded whenever the hit position is varied.

(3) In another feature of the electron microscope of the invention of (1) above, the illumination system may include an angular scanner for scanning the angle of incidence of the impinging electron beam relative to the sample. The variations in the illumination conditions may be variations in the angle of incidence.

In this electron microscope, plural images having a one-to-one correspondence with different angles of incidence of the electron beam relative to the sample can be recorded as one image in the imager. Therefore, the recording time can be shortened as compared with the case where an image is recorded whenever the angle of incidence is varied.

(4) In one feature of the electron microscope of any one of the inventions described in (1)-(3) above, there may be further included an active incident region defining portion for defining the shape and size of the active electron incident region.

In this electron microscope, overlap of adjacent images on the photosensitive surface of the imager can be prevented.

(5) In one feature of the electron microscope of the invention of (4) above, the active incident region defining portion may be a mask having at least one opening corresponding in shape and size to the active electron incident region. The electron deflector may deflect electrons passed through the opening.

In this electron microscope, it is possible to prevent overlap of adjacent images on the photosensitive surface of the imager.

(6) In one feature of the electron microscope of the invention of (5) above, there may be further included a moving mechanism for moving the mask. The mask has the at least one opening which is plural in number and mutually different in size.

In this electron microscope, the active opening can be switched by moving the mask by means of the moving mechanism. Therefore, the size of the active incident region can be varied.

(7) In another feature of the electron microscope of the invention of (5) above, there may be further included an optical system disposed in a stage following the mask. The optical system is used to control the size of the active electron incident region.

In this electron microscope, the optical system for controlling the size of the active electron incident region is included and, therefore, the size of the active electron incident region can be varied.

(8) In one feature of the electron microscope of any one of the inventions described in (1)-(7) above, the electron deflector may be made up of plural deflector units arranged along an optical axis.

In this electron microscope, electrons can be made to impinge perpendicularly on the photosensitive surface of the imager. Consequently, if the electrons transmitted through the sample are deflected by the electron deflector, the aspect ratio of the image formed on the photosensitive surface of the imager can be kept constant.

(9) In one feature of the electron microscope of any one of the inventions described in (1)-(8) above, plural images detected by the photosensitive surface may be recorded as one image by the imager.

In this electron microscope, plural images obtained by the imager in response to variations in the illumination conditions are recorded as one image and so the recording time can be shortened as compared with the case where an image is recorded whenever the illumination conditions are varied.

(10) In one feature of the electron microscope of the invention of (9) above, the controller may control the electron deflector such that the images detected first and last, respectively, by the photosensitive surface out of the images recorded as one image by the imager are adjacent to each other.

In this electron microscope, in a case where the process for recording plural images as one image is repeated, it is possible to shorten the time taken to return the active electron incident region from the position of the active electron incident region where the image detected last is formed to the position of the active electron incident region where the image detected first is formed. Accordingly, where the process for recording plural images as one image is repeated, the recording time can be shortened.

(11) In one feature of the electron microscope of any one of the inventions described in (1)-(10) above, the photosensitive surface may be divided into plural photosensitive surface parts. The imager may record plural detected images as one image for each of the photosensitive surface parts.

In this electron microscope, while images are being detected by one photosensitive surface part, images can be read out from the other photosensitive surface part or parts. Consequently, the recording time can be shortened.

(12) In one feature of the electron microscope of any one of the inventions described in (1)-(11) above, the illumination system may include an electron beam blanker for blanking or cutting off the electron beam. The controller may control the electron beam blanker to prevent the electron beam from hitting the sample while the electron beam deflector is varying the active electron incident region.

In this electron microscope, it is possible to prevent electrons from hitting the photosensitive surface of the imager while the active electron incident region is being varied.

(13) An image acquisition method associated with the present invention is implemented in an electron microscope operative to illuminate a sample with an electron beam and to detect electrons transmitted through the sample. The method may involve deflecting the electrons transmitted through the sample such that an active electron incident region of a photosensitive surface of an imager which is currently hit by the electron beam is varied in response to variations in illumination conditions under which the electron beam is made to impinge on the sample.

In this image acquisition method, plural images obtained in response to variations in the illumination conditions can be recorded as one image by the imager. Consequently, the recording time can be shortened as compared with the case where an image is recorded whenever the illumination conditions are varied.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment 1.1. Configuration of Electron Microscope

Figure 1:
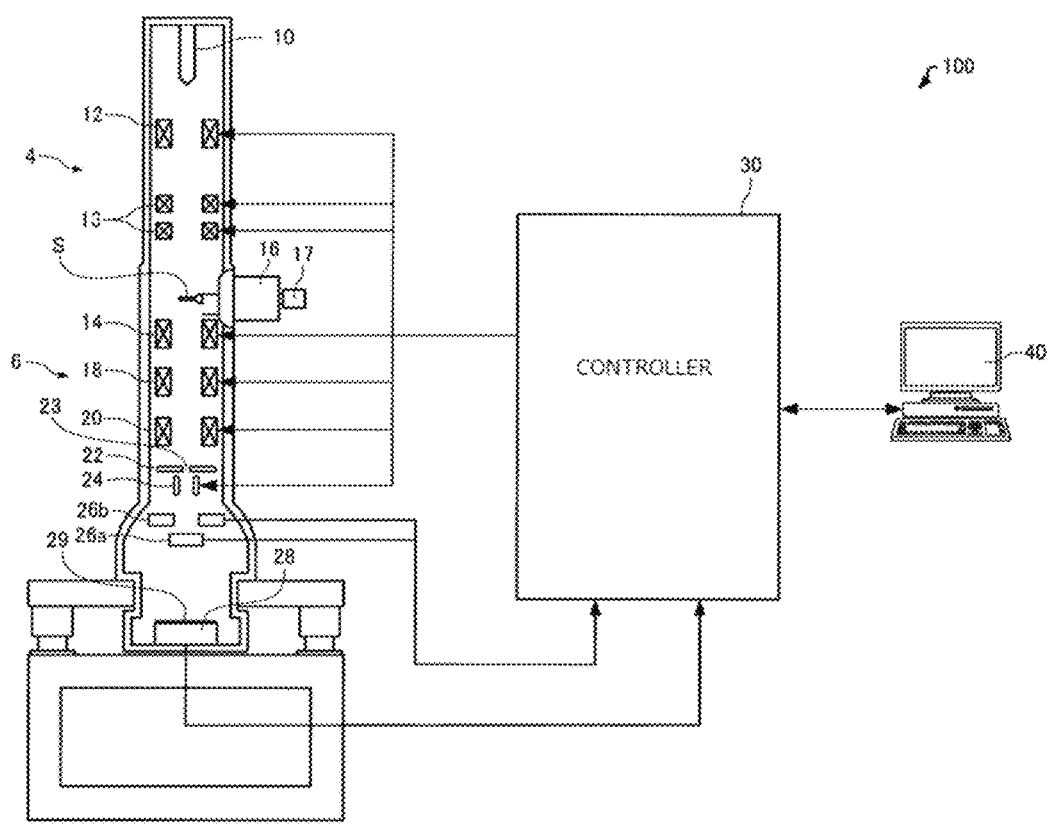
FIG. 1 is a schematic vertical cross section, partly in block form, of an electron microscope associated with a first embodiment of the present invention.

An electron microscope associated with a first embodiment of the present invention is first described by referring to FIG. 1, which shows the electron microscope, 100, associated with the first embodiment.

The electron microscope 100 is a scanning transmission electron microscope (STEM). That is, the electron microscope 100 is an instrument for obtaining a scanning transmission electron microscope (STEM) image by scanning an electron probe (focused electron beam) over a sample S and detecting electrons transmitted through the sample S.

In the electron microscope 100, plural convergent beam electron diffraction (CBED) patterns corresponding to various positions on the sample S in a one-to-one relationship can be obtained by scanning the conically focused electron beam over the sample S such that CBED patterns are created by electrons transmitted through the sample S and recording the CBED patterns by an imager 28. That is, in the electron microscope 100, plural CBED patterns corresponding to pixels of an STEM image in a one-to-one relationship can be obtained.

As shown in FIG. 1, the electron microscope 100 includes an electron source 10, a condenser lens system 12, scan coils 13 (which constitute one example of positional scanner), an objective lens 14, a sample stage 16, a sample holder 17, an intermediate lens 18, a projector lens 20, a mask 22 (which constitutes one example of active incident region defining portion), an electron deflector 24, STEM detectors 26a, 26b, the imager 28, a controller 30, and a personal computer (PC) 40.

The electron source 10 produces an electron beam. For example, the electron source 10 is an electron gun that emits the electron beam by accelerating electrons, emitted from a cathode, by means of an anode.

The condenser lens system 12 focuses the electron beam emitted from the electron source 10. The condenser lens system 12 may be composed of a plurality of electron lenses (not shown).

The scan coils 13 operate to deflect the electron beam such that the electron beam (electron probe) focused by the condenser lens system 12 and objective lens 14 is scanned over the sample S. That is, the scan coils 13 are used to scan the position on the sample S hit by the electron beam (i.e., positional scanning).

The objective lens 14 is used to focus the electron beam onto the sample S and to form the electron probe. Furthermore, the objective lens 14 focuses the electron beam transmitted through the sample S.

The condenser lens system 12, scan coils 13, and objective lens 14 together constitute an illumination system 4 for focusing the electron beam onto the sample S.

The sample stage 16 holds the sample S. In the illustrated example, the sample stage 16 holds the sample S via the sample holder 17. The sample stage 16 permits the sample S to be moved horizontally or vertically and tilted.

The intermediate lens 18 and projector lens 20 cooperate to guide the electrons transmitted through the sample S toward the STEM detectors 26a and 26b. The intermediate lens 18 and projector lens 20 further magnify the image focused by the objective lens 14 and focus the image onto the imager 28. The objective lens 14, intermediate lens 18, and projector lens 20 together constitute an imaging system 6 for focusing the electrons transmitted through the sample S.

The mask 22 is used to define the shape and size (area) of the active electron incident region of the photosensitive surface 29 of the imager 28. The mask 22 has an opening 23 for passing some of the electrons transmitted through the sample S. The shape and size of the opening 23 in the mask 22 correspond to the shape and size of the active incident region. The shape of the opening 23 is square, for example. The mask 22 is positioned in a stage following (i.e., behind) the projector lens 20 (i.e., on the downstream side relative to the direction of the stream of electrons). No restriction is imposed on the position of the mask 22 as long as it is located behind the sample S or objective lens 14.

When the electron beam is made to hit the sample S at a position, the active electron region of the photosensitive surface 29 of the imager 28 referred to herein is a region on which electrons transmitted from the hit position on the sample S enter the photosensitive surface 29. The active electron incident region of the photosensitive surface 29 hit by the beam can be limited by the use of the mask 22.

The electrons transmitted through the sample S are deflected in a two-dimensional manner by the electron deflector 24. The electron deflector 24 is located behind the mask 22 and deflects the electrons passed through the opening 23 in the mask 22. For example, the electron deflector 24 is an electrostatic deflector or made of deflecting plates for deflecting the electrons by an electric field. The electron deflector 24 may also be an electromagnetic deflector for deflecting the electrons by a magnetic field.

The bright-field STEM detector 26a detects electrons transmitted without scattering and electrons scattered at angles less than a given angle out of the electrons transmitted through the sample S. Although the bright-field STEM detector 26a is located on the optical axis, the detector 26a can be retracted from the optical axis when the imager 28 is used. An intensity signal (detection signal) indicative of electrons detected by the bright-field STEM detector 26a is imaged in synchronism with the scan signal. Consequently, a bright-field STEM image is generated and displayed on the display screen of the PC 40.

The dark-field STEM detector 26b detects electrons scattered at a certain angle from the sample S. This detector 26b is an annular detector. An intensity signal (detection signal) indicative of electrons detected by the dark-field STEM detector 26b is imaged in synchronism with the scan signal. As a result, a dark-field STEM image such as a high-angle annular dark-field scanning microscope (HAADF-STEM) image is generated and displayed on the display screen of the PC 40.

The imager 28 captures images focused by the imaging system 6. The images focused by the imaging system 6 include electron diffraction patterns (CBED patterns). The imager 28 has the photosensitive surface 29 for detecting electrons. The imager 28 detects the electrons transmitted through the sample S by means of the photosensitive surface 29 and records images (electron diffraction patterns) formed by the electrons transmitted through the sample S. The imager 28 is configured, for example, including a CMOS (complementary MOS) image sensor or a CCD (charge-coupled device) image sensor. The imager 28 records images using the image sensor such as a CMOS or CCD image sensor.

The imager 28 may be configured including a scintillator and an optical fiber. That is, in the imager 28, electrons are converted into photons by the scintillator. Images may be recorded after transferring the photons to the CMOS or CCD image sensor via the optical fiber. Alternatively, the imager 28 may record images by directly detecting electrons by its CMOS or CCD image sensor. Data about the images (electron diffraction patterns) recorded by the imager 28 is fed to the PC 40 via the controller 30.

The controller 30 controls the various components 10, 12, 13, 14, 16, 18, 20, 24, and 28 of the electron microscope 100. The functions of the controller 30 may be realized by dedicated circuitry or by executing computer programs using a processor (such as a CPU).

1.2. Operation of Electron Microscope

The operation of the electron microscope 100 is next described. An operation of the electron microscope 100 for acquiring plural convergent beam electron diffraction (CBED) patterns corresponding to various positions on the sample S in a one-to-one relationship is described below.

In the electron microscope 100, the electron beam emitted from the electron source 10 is constricted conically by the condenser lens system 12 and objective lens 14 and made to impinge on the sample S. The electrons transmitted through the sample S are made to impinge on the photosensitive surface 29 of the imager 28 through the objective lens 14, intermediate lens 18, and projector lens 20 and are detected.

The electrons transmitted through the sample S form a convergent beam electron diffraction (CBED) pattern at the back focal plane of the objective lens 14. This CBED pattern is magnified by the intermediate lens 18 and projector lens 20 and focused onto the photosensitive surface 29 of the imager 28. Therefore, the imager 28 can record the CBED pattern.

In the electron microscope 100, the CBED pattern is recorded at each hit position on the sample S by scanning the conically constricted electron beam over the sample S, i.e., positionally scanning the electron beam.

At this time, if a CBED pattern is recorded by the imager 28 whenever the hit position is varied, it will take long to record the patterns. For example, even if a high-speed camera is used, the time (recording time) taken to record one image (CBED pattern) is about 250 μsec. Considering the fact that where a general STEM detector using a combination of a photomultiplier (PMT) and a scintillator is employed, the recording time for an electron intensity signal is approximately 40 μsec, the recording speed is low even if such a high-speed camera is used.

Accordingly, in the electron microscope 100, the controller 30 controls the electron deflector 24 in such a way that the active electron incident region of the photosensitive surface 29 of the imager 28 is varied in response to positional scanning of the electron beam impinging on the sample S. Consequently, the imager 28 can record plural CBED patterns as one image. Thus, the readout time and recording time can be shortened.

Figure 2:
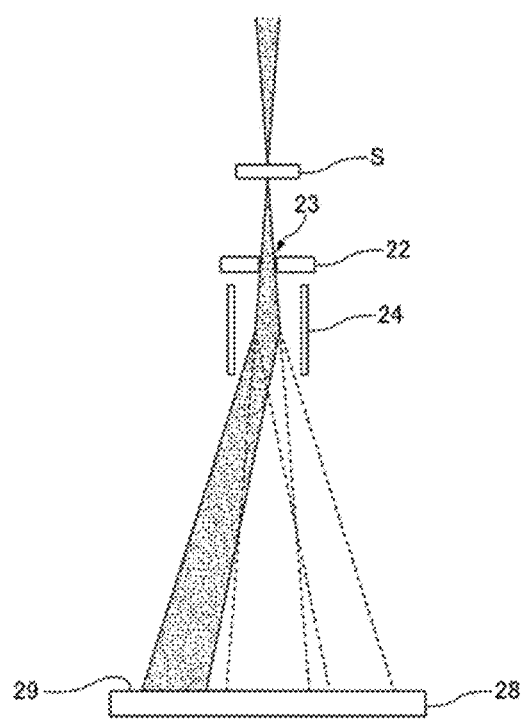
FIG. 2 is an electron ray diagram illustrating the functions of a mask and of an electron deflector included in the electron microscope shown in FIG. 1.
Figure 3:
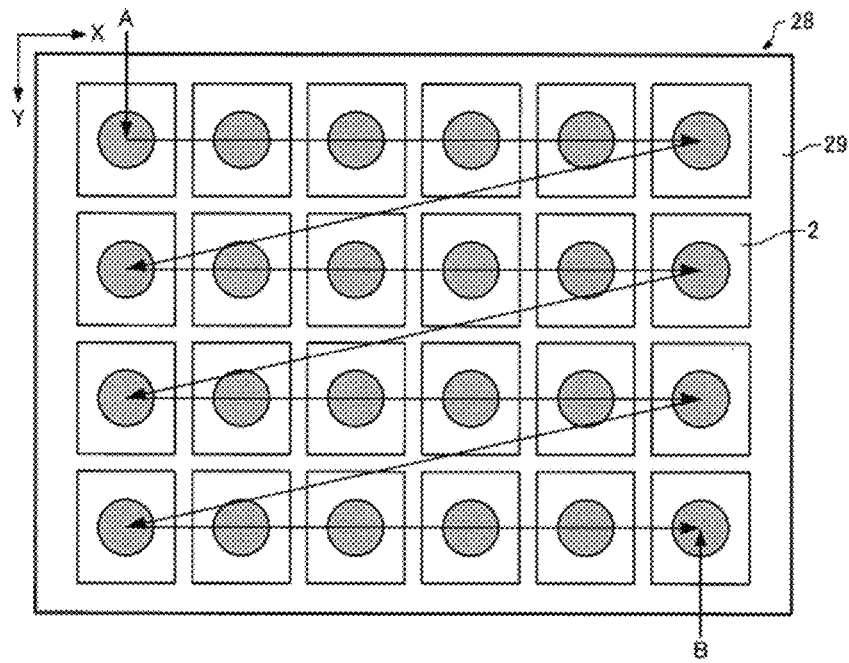
FIG. 3 is a schematic representation of the photosensitive surface of an imager included in the electron microscope shown in FIG. 1.

FIG. 2 illustrates the functions of the mask 22 and electron deflector 24 of the electron microscope 100. In FIG. 2, members other than the mask 22, electron deflector 24, and imager 28 are omitted from being shown. FIG. 3 schematically shows the photosensitive surface 29 of the imager 28. In FIG. 3, X and Y axes are shown as two mutually intersecting axes.

As shown in FIG. 2, the electrons transmitted through the sample S pass through the opening 23 in the mask 22. As a result of this passage, undesired electrons are cut off, and the shape and size of the active electron incident region 2 of the photosensitive surface 29 are defined.

The electrons passing through the mask 22 are deflected by the electron deflector 24. The controller 30 controls the electron deflector 24 such that the active electron incident region 2 of the photosensitive surface 29 which is currently hit by the beam is switched in response to the positional scanning of the electron beam that is made to impinge on the sample S, i.e., in response to variation of the hit position on the sample S. As a result, electrons passed through the mask 22 impinge on respective different incident regions 2 according to the varied hit position on the sample S. In each incident region 2, a CBED pattern corresponding to the hit position is formed. As a consequence, plural CBED patterns are detected at the photosensitive surface 29 of the imager 28.

The controller 30 controls the electron deflector 24 such that plural rows and plural columns of CBED pattern are detected by the photosensitive surface 29 of the imager 28.

The controller 30 moves or varies the active incident region 2, for example, in the order indicated by the arrows in FIG. 3. In particular, the active incident region 2 is moved in the +X-axis direction from its initial position A (that is at the position of the end of the photosensitive surface 29 as viewed both in the −X-axis direction and in the −Y-axis direction). After the active incident region 2 is moved to the end of the photosensitive surface 29 in the +X-axis direction, the region is then moved in the +Y-axis direction. Similarly, the region is moved from the end in the −X-axis direction to the end in the +X-axis direction. By repeating this process, the active incident region 2 is moved to a final position B that is at the position of the end of the photosensitive surface 29 as viewed both in the +X-axis direction and in the +Y-axis direction. Consequently, plural rows and plural columns of CBED pattern are detected by the photosensitive surface 29 of the imager 28.

The plural CBED patterns detected by the photosensitive surface 29 are recorded as one image by the imager 28. That is, the imager 28 permits the plural CBED patterns detected by the photosensitive surface 29 to be read out at once. In the example of FIG. 3, the imager 28 records 24 CBED patterns as one image. More specifically, in the imager 28, CBED patterns are detected in turn by the photosensitive surface 29 by the positional scanning. No readout is performed until a preset number of CBED patterns are detected. If the preset number (24 in the example of FIG. 3) of CBED patterns are detected, the plural (24) CBED patterns are read out from the imager 28 at once. Consequently, the plural CBED patterns are recorded as one image.

As one example, assuming that one image (CBED pattern) is made up of n pixels×n pixels and the imager 28 has N×N pixels, the number of pixels that can be recorded in the imager 28 is ideally $(N/n)^2$ but a spacing as long as several pixels needs to be secured between adjacent pixels. Let p the number of pixels constituting this spacing. The number of pixels m that can be recorded in the imager 28 in practice is $m=(N/(n+p))^2$.

The imager 28 can record multiple CBED patterns at high speed by repeating the process of recording plural CBED patterns as one image.

In the imager 28, an image (CBED pattern) is detected by converting electrons hitting the pixels (photodiodes) of the image sensor into electric charges and storing them. The electric charges stored in the pixels (photodiodes) are read out, for example, as voltage. Images can be recorded by detecting them and reading out the detected images in this way.

Figure 4:
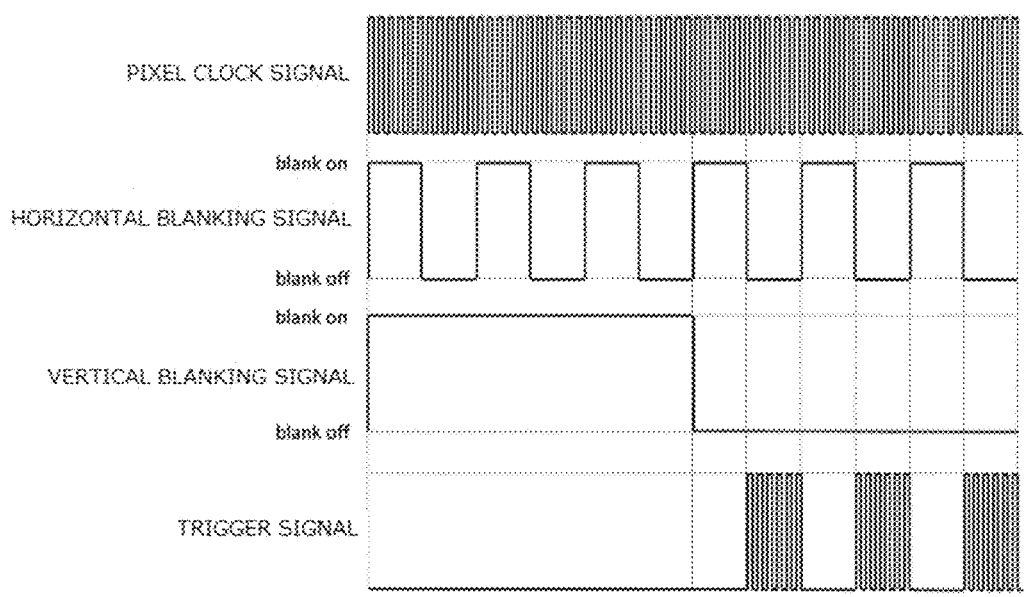
FIG. 4 is a diagram illustrating a pixel clock signal, a horizontal blanking signal, a vertical blanking signal, and a trigger signal.

FIG. 4 illustrates a pixel clock signal, a horizontal blanking signal, a vertical blanking signal, and a trigger signal.

The horizontal blanking signal indicates a blanking period during horizontal scanning of the electron beam scanned in two dimensions over the sample S. During the blanking period, the electron beam is blanked (cut off). The horizontal blanking signal indicates the beginning and end of a horizontal scan of the electron beam.

The vertical blanking signal indicates a blanking period during vertical scanning of the electron beam that is scanned in two dimensions over the sample S. The vertical blanking signal indicates the beginning and end of one frame of the electron beam.

The controller 30 controllably operates the electron deflector 24 in synchronism with the pixel clock signal, horizontal blanking signal, and vertical blanking signal. Consequently, the electron beam transmitted through the sample S is deflected by the electron deflector 24 at the timing as indicated by the trigger signal shown in FIG. 4.

Image data about images including the plural CBED patterns recorded by the imager 28 is fed to the PC 40, for example, via the controller 30. The PC 40 extracts the plural CBED patterns from the image data and brings the extracted patterns into a one-to-one correspondence with positions on the sample S. As a result, the plural CBED patterns having a one-to-one correspondence with positions on the sample S can be derived.

As shown in FIG. 2, the electrons passed through the mask 22 are deflected by the electron deflector 24 and may obliquely hit the photosensitive surface 29. In this case, the CBED patterns recorded by the imager 28 are distorted trapezoidally. Therefore, the PC 40 may perform processing to correct the trapezoidal distortion of each CBED pattern.

The PC 40 generates various images from the CBED patterns having a one-to-one correspondence with positions on the sample S.

For instance, a HAADF-STEM image can be generated by extracting intensity information about electrons inelastically scattered at high angles from the CBED patterns having a one-to-one correspondence with positions on the sample S.

Furthermore, an ABF-STEM (annular bright-field scanning transmission electron microscope) image can be generated by extracting intensity information about electrons present around the optical axis (e.g., 12-24 mrad from the optical axis) of a direct-beam disk corresponding to transmitted waves from the CBED patterns having a one-to-one correspondence with positions on the sample S.

In addition, high-contrast STEM images can be generated from the CBED patterns having a one-to-one correspondence with positions on the sample S. This is especially effective for samples such as high molecular samples and biological samples which show only low contrast if ordinary STEM images are used.

The electron microscope 100 associated with the first embodiment has the following features. The electron microscope 100 includes the electron deflector 24 for deflecting the electrons transmitted through the sample S. The controller 30 controls the electron deflector 24 in such a way that the active electron incident region 2 of the photosensitive surface 29 of the imager 28 is varied in response to positional scanning of the electron beam impinging on the sample S, i.e., in response to variation of the hit position on the sample S. Therefore, the imager 28 can record plural CBED patterns as one image, the CBED patterns having a one-to-one correspondence with positions on the sample S. Consequently, plural CBED patterns having a one-to-one correspondence with positions on the sample S are recorded in a reduced time as compared, for example, to the case where a recording is made whenever a CBED pattern is obtained after varying the hit position (i.e., the hit position is varied, one CBED pattern is detected, and then this single CBED pattern is read out). If the imager 28 has a multiplicity of pixels, it is not necessary to perform a readout for each CBED pattern. Rather, plural CBED patterns can be read out at a time.

Additionally, the electron microscope 100 does not need to be equipped with a dedicated high-speed camera for recording plural CBED patterns having a one-to-one correspondence with positions on the sample S. The microscope can record CBED patterns using a CMOS or CCD camera designed for observation of normal TEM images.

The electron microscope 100 includes the mask 22 that defines the size of the active electron incident region 2 of the photosensitive surface 29 of the imager 28. Therefore, it is possible to prevent overlap of adjacent CBED patterns on the photosensitive surface 29 of the imager 28.

The image acquisition method associated with the first embodiment involves deflecting electrons transmitted through the sample S such that the active electron incident region 2 of the photosensitive surface 29 of the imager 28 is varied in response to positional scanning of the electron beam impinging on the sample S. Therefore, the imager 28 can record plural CBED patterns as one image, the CBED patterns having a one-to-one correspondence with positions on the sample S. Hence, the recording time can be shortened.

1.3. Modifications of Electron Microscope

Modifications of the electron microscope associated with the first embodiment are next described. Only the differences with the above-described electron microscope 100 are described below; a description of similarities is omitted.

(1) First Modification

Figure 5:
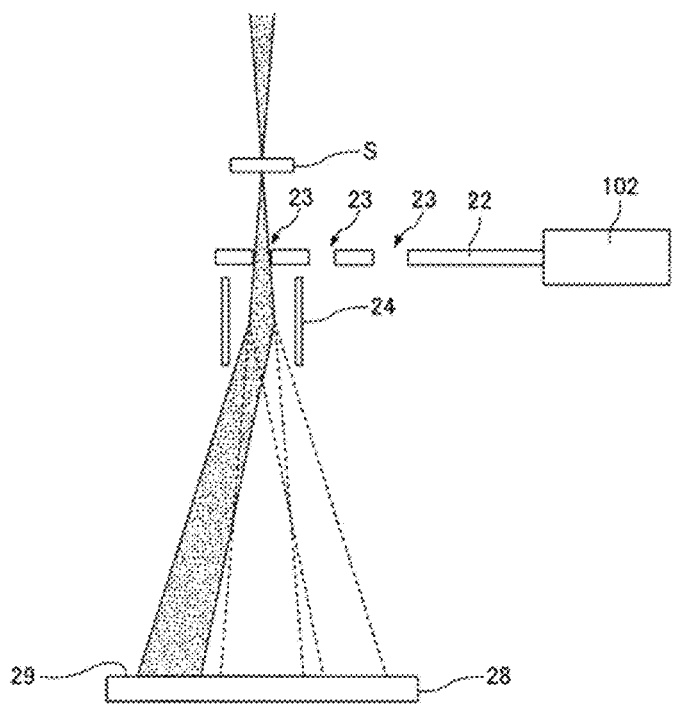
FIG. 5 is an electron ray diagram illustrating the functions of a mask included in an electron microscope associated with a first modification of the first embodiment.
Figure 6:
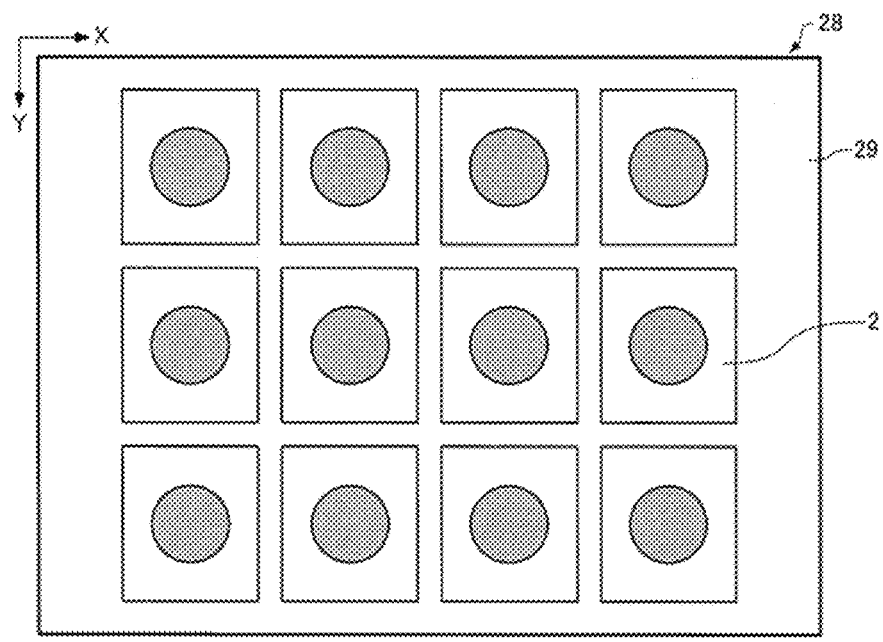
FIG. 6 is a schematic representation of the photosensitive surface of the imager of the electron microscope shown in FIG. 5.

An electron microscope associated with a first modification is first described. FIG. 5 illustrates the functions of the mask 22 of the electron microscope associated with the first modification. FIG. 6 schematically shows the photosensitive surface 29 of the imager 28 of the electron microscope associated with the first modification. In the example of FIG. 6, openings 23 greater than that shown in above referenced FIG. 3 are used.

In the above-described electron microscope 100, the mask 22 has only one opening 23 as shown in FIG. 2. On the other hand, in the electron microscope associated with the first modification, there are plural openings 23 which are different in size (area) from each other as shown in FIG. 5.

Furthermore, the electron microscope associated with the first modification has a mask moving mechanism 102 for moving the mask 22. The active opening 23 can be switched by moving the mask 22 by means of the mask moving mechanism 102. That is, the desired opening 23 can be brought onto the optical axis by the mask moving mechanism 102.

The mask moving mechanism 102 may be either a nonmanual mechanism for moving the mask 22 using a pulsed motor or the like or a manual mechanism for moving the mask 22.

In the electron microscope associated with the first modification, the mask 22 has the plural openings 23 which are different in size from each other. The mask moving mechanism 102 can move the mask 22. As noted above, the sizes of the openings 23 correspond to sizes of the active incident region 2. Therefore, the size (area) of the active electron incident region 2 of the photosensitive surface 29 of the imager 28 can be varied by switching the active opening 23 by moving the mask 22 using the mask moving mechanism 102.

For example, in the example shown in FIG. 6, the openings 23 which are greater in size than the opening of the example shown in FIG. 3 are used and so the active incident region 2 can have greater areas. As a result, it is possible to have a greater number of pixels on image data about each obtained CBED pattern. Hence, the CBED pattern can be analyzed in further detail.

The number of incident regions 2 that can be placed on the photosensitive surface 29 can be varied, for example, by changing the size of the active incident region 2 and, therefore, the number of CBED patterns capable of being recorded as one image in the imager 28 can be varied.

(2) Second Modification

Figure 7:
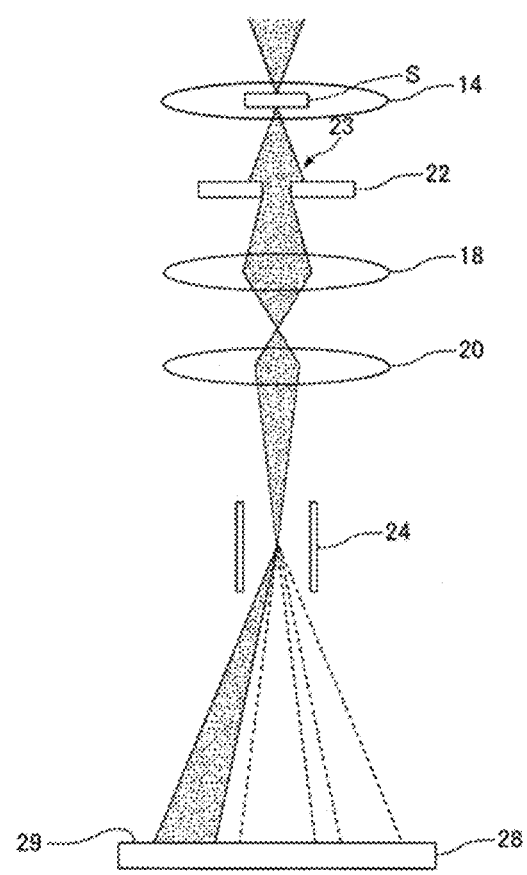
FIGS. 7 and 8 are electron ray diagrams illustrating the functions of a mask and of an electron deflector included in an electron microscope associated with a second modification of the first embodiment.

An electron microscope associated with a second modification is next described. FIG. 7 illustrates the functions of the mask 22 and electron deflector 24 of an electron microscope associated with the second modification.

In the above-described electron microscope 100, the mask 22 is placed behind the projector lens 20 as shown in FIG. 1. On the other hand, in the electron microscope associated with the second modification, the mask 22 is placed at the back focal plane of the objective lens 14 as shown in FIG. 7. In this arrangement, the size (area) of the active incident region 2 can be varied by varying the excitations of the intermediate lens 18 and projector lens 20.

The position of the mask 22 is not restricted to the back focal plane of the objective lens 14. For example, the mask 22 may be placed at a plane conjugate to the back focal plane of the objective lens 14. Also, in this case, the size of the active incident region 2 can be similarly varied by changing the excitations of the intermediate lens 18 and projector lens 20.

Figure 8:
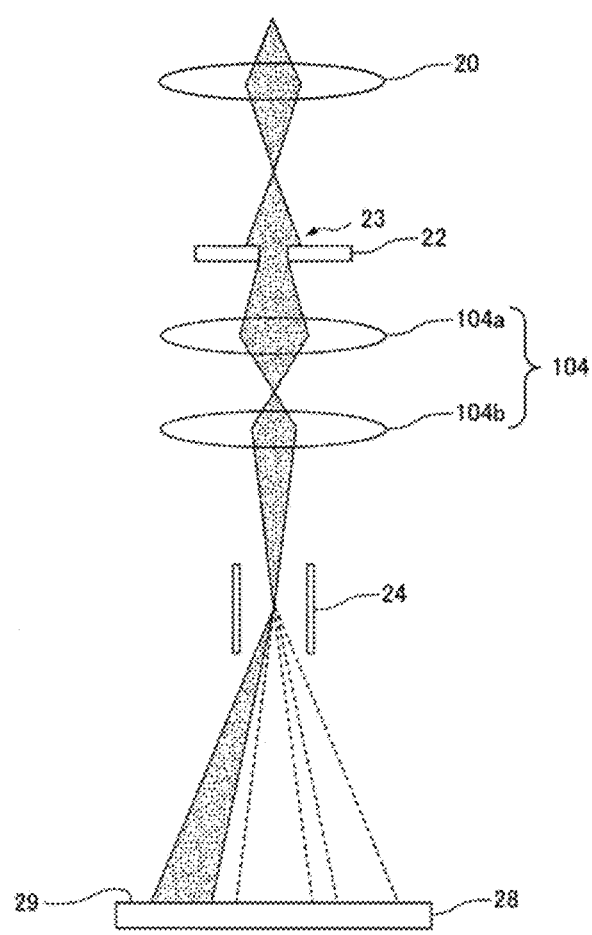

In the example shown in FIG. 7, the mask 22 is placed at the back focal plane of the objective lens 14, and the intermediate lens 18 and projector lens 20 are operated as lenses for controlling the size of the active incident region 2. Alternatively, as shown in FIG. 8, the mask 22 may be located behind the projector lens 20. An optical system 104 for controlling the size of the active incident region 2 may be placed behind the mask 22. The optical system 104 may be composed of plural electron lenses (electron lenses 104a, 104b in the illustrated example).

Since the electron microscope associated with the second modification includes the optical system for controlling the size of the active electron incident region 2, the size (area) of the active incident region 2 can be varied. Therefore, the electron microscope associated with the second modification can yield advantageous effects similar to those as provided by the above-described electron microscope associated with the first modification.

(3) Third Modification

Figure 9:
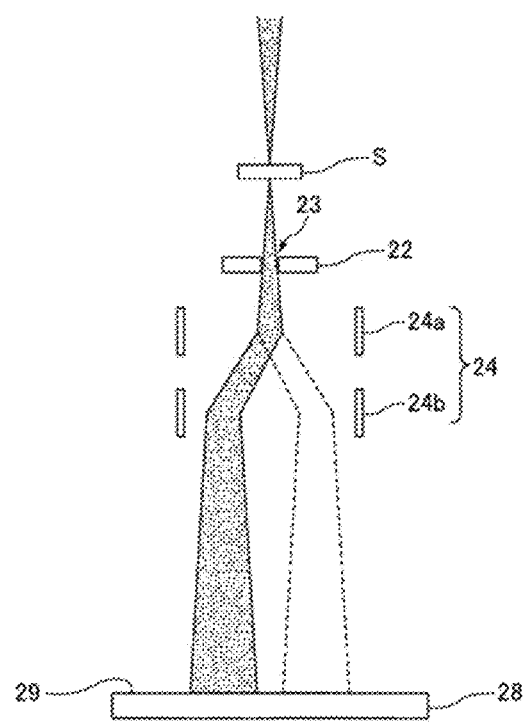
FIG. 9 is an electron ray diagram illustrating the functions of a mask and of an electron deflector included in an electron microscope associated with a third modification of the first embodiment.

An electron microscope associated with a third modification is next described. FIG. 9 illustrates the functions of the mask 22 and electron deflector 24 of the electron microscope associated with the third modification.

In the above-described electron microscope 100, the electron deflector 24 is made of one deflector as shown in FIG. 2. On the other hand, in the electron microscope associated with the third modification, the electron deflector 24 is made up of two stages of deflector units 24a and 24b arranged along the optical axis of the imaging system 6 of the electron microscope.

Because the electron deflector 24 is made up of two stages of deflector units 24a and 24b, electrons transmitted through the mask 22 can be deflected twice as shown in FIG. 9. Consequently, the electrons can be made to impinge perpendicularly on the photosensitive surface 29.

In the example shown in FIG. 9, the electron deflector 24 is made up of two stages deflector units 24a and 24b. The electron deflector 24 may also be made up of three or more stages of deflector units arranged along the optical axis.

In the electron microscope associated with the third modification, the electron deflector 24 is made up of multiple stages of deflector units arranged along the optical axis and, therefore, electrons can be made to impinge perpendicularly on the photosensitive surface 29. Consequently, CBED patterns recorded by the imager 28 are not distorted trapezoidally. In the electron microscope associated with the third modification, therefore, the PC 40 does not need to perform processing to correct trapezoidal distortion of each CBED pattern.

(4) Fourth Modification

Figure 10:
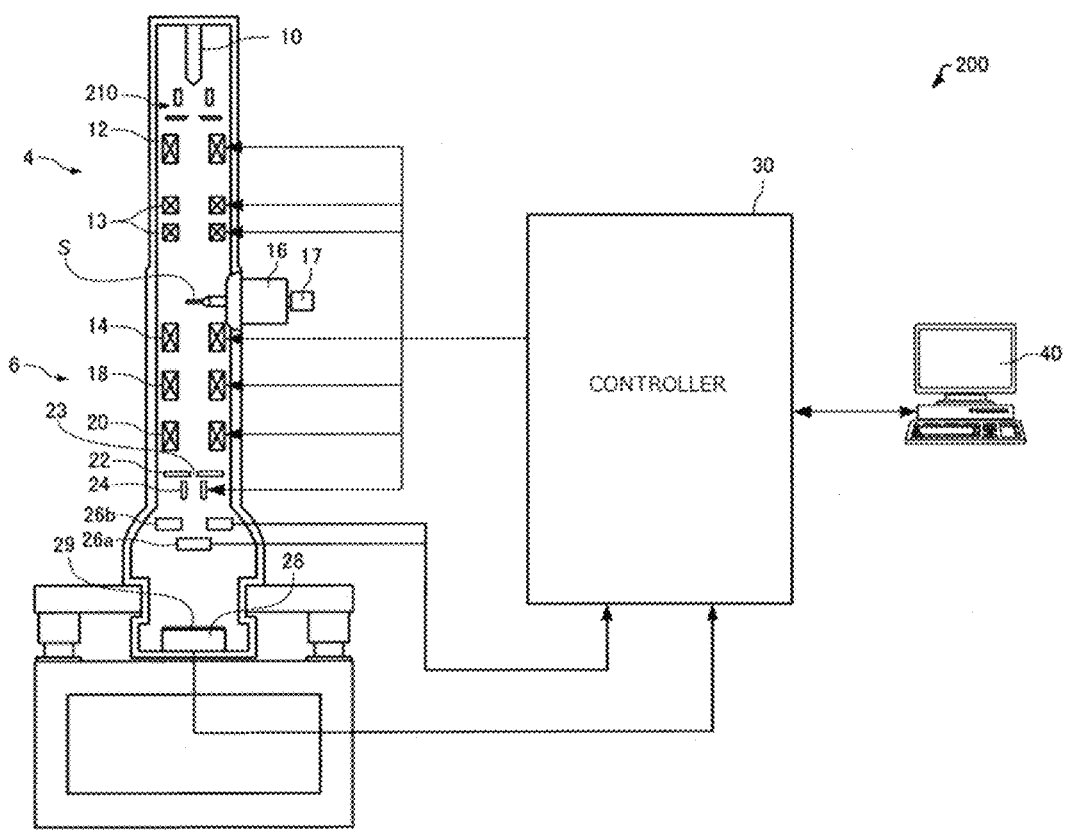
FIG. 10 is a schematic vertical cross section similar to FIG. 1, but showing an electron microscope associated with a fourth modification of the first embodiment.

An electron microscope associated with a fourth modification is next described. FIG. 10 schematically shows the electron microscope, 200, associated with the fourth modification.

The electron microscope 200 associated with the fourth modification is equipped with an electron beam blanker 210 that blanks the electron beam emitted from the electron source 10 such that the beam does not hit the sample S as shown in FIG. 10. The electron beam blanker 210 is incorporated in the illumination system 4 and disposed behind the electron source 10 and between the electron source 10 and the condenser lens system 12.

Figure 11:
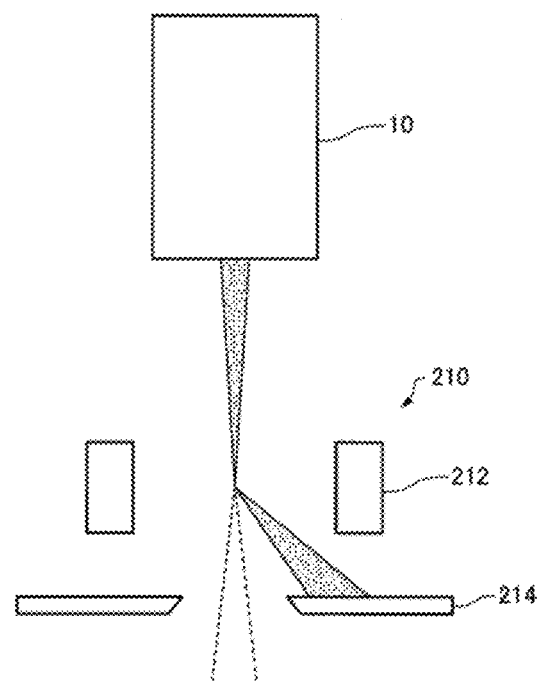
FIG. 11 is an electron ray diagram illustrating the function of an electron beam blanker of the electron microscope shown in FIG. 10.

FIG. 11 illustrates the function of the electron beam blanker 210. The beam blanker 210 is configured including a deflector 212 and an aperture 214. The deflector 212 deflects the electron beam emitted from the electron source 10. The deflector 212 may be either an electrostatic deflector or an electromagnetic deflector. The aperture 214 has an aperture hole for passing the electrons emitted from the electron source 10.

Where the electron beam is made to impinge on the sample S, the deflector 212 either deflects the electron beam such that it passes through the aperture hole in the aperture 214 or undeflects the beam. Consequently, the electron beam emitted from the electron source 10 is made to impinge on the sample S.

On the other hand, where the electron beam is not made to impinge on the sample S, the deflector 212 deflects the beam such that the beam is blocked by the aperture 214, i.e., the beam will not pass through the aperture hole. Consequently, the electron beam emitted from the electron source 10 is blocked by the aperture 214 and blanked such that the beam does not hit the sample S.

Figure 12:
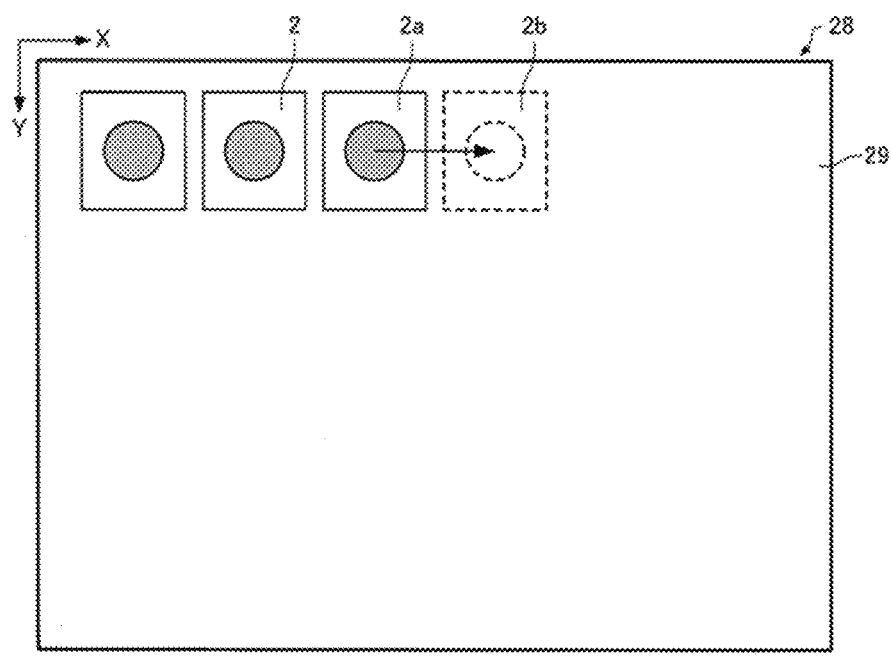
FIG. 12 is a schematic representation of the photosensitive surface of an imager included in the electron microscope shown in FIG. 10, illustrating the function of the electron beam blanker.

The controller 30 controls the electron beam blanker 210 to prevent the electron beam from hitting the sample S while the electron deflector 24 is varying the active incident region 2. For example, as shown in FIG. 12, when the active electron incident region is being varied from 2a to 2b of the photosensitive surface 29, the controller 30 controls the beam blanker 210 to cut off the electron beam emitted from the electron source 10. The controller 30 may synchronize the blanking operation performed by the electron beam blanker 210 with the pixel clock signal shown in FIG. 4. Consequently, the beam blanker 210 can be controlled such that the electron beam does not hit the sample S while the electron deflector 24 is switching the active incident region 2.

In the electron microscope 200 associated with the fourth modification, the controller 30 controls the electron beam blanker 210 to prevent the electron beam from hitting the sample S while the electron deflector 24 is switching the active incident region 2. Consequently, in the electron microscope 200, impingement of electrons on the photosensitive surface 29 of the imager 28 can be prevented while the electron deflector 24 is switching the active incident region 2.

(5) Fifth Modification

Figure 13:
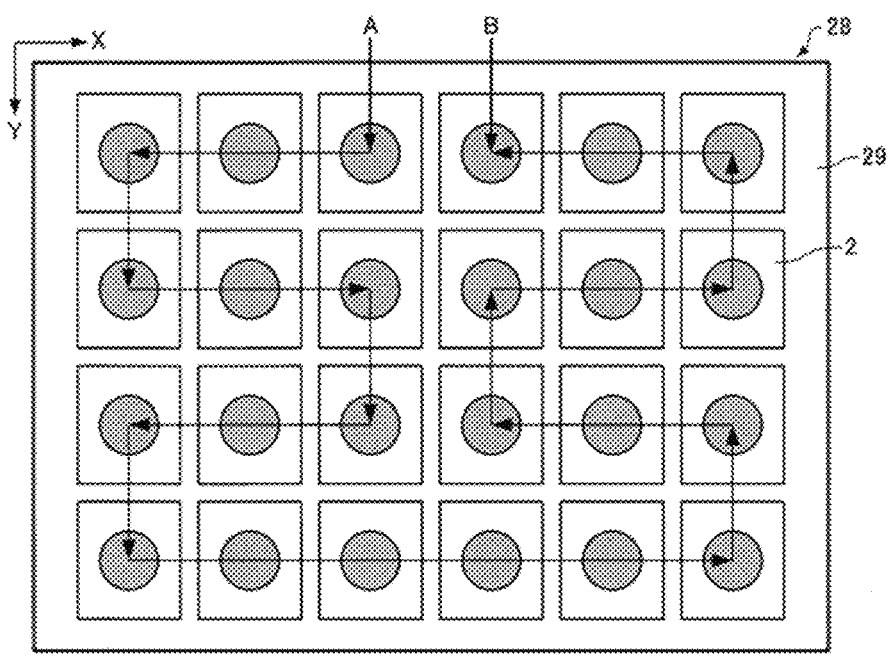
FIG. 13 is a diagram illustrating the order in which the active electron incident region of an electron microscope associated with a fifth modification of the first embodiment is moved.

An electron microscope associated with a fifth modification is next described. FIG. 13 illustrates the order in which the active incident region 2 is moved in the electron microscope associated with the fifth modification.

In the above-described electron microscope 100, the controller 30 controls the active incident region 2 in the order as indicated by the arrows in FIG. 3.

On the other hand, in the electron microscope associated with the fifth modification, the controller 30 moves the active incident region 2 in the order as indicated by the arrows shown in FIG. 13.

As shown in FIG. 13, the controller 30 controls the electron deflector 24 such that CBED patterns detected first and last, respectively, out of CBED patterns recorded as one image in the imager 28 are adjacent to each other without any other intervening CBED pattern therebetween. By controlling the electron deflector 24 such that CBED patterns detected first and last, respectively, are adjacent to each other, the recording time can be shortened in a case where the process for recording plural CBED patterns as one image is repetitively performed.

For example, in the example shown in FIG. 3, the CBED patterns detected first and last, respectively, are not adjacent to each other and, therefore, if the process for recording plural CBED patterns as one image is repeated, it takes some time to return the active incident region 2 from the final position B to the initial position A. On the other hand, in the example shown in FIG. 13, the CBED patterns detected first and last, respectively, are adjacent to each other and, therefore, if the process for recording plural CBED patterns as one image is repeatedly performed, the time taken to return the active incident region 2 from the final position B to the initial position A can be shortened. Consequently, the recording time can be shortened.

As shown in FIG. 13, the controller 30 moves the active incident region 2 in the −X-axis direction from the initial position A to the end as taken in the −X-axis direction and then moves the incident region in the +Y-axis direction. Then, the controller moves the active incident region 2 in the +X-axis direction from the end as taken in the −X-axis direction. That is, if the active incident region 2 is moved in the Y-axis direction after moved in the +X-axis direction, the controller 30 then moves the incident region 2 in the reverse direction, i.e., −X-axis direction. Similarly, if the active incident region 2 is moved in the Y-axis direction after moved in the +X-axis direction, the controller then moves the active incident region 2 in the +X-axis direction. That is, the controller 30 moves the active incident region 2 in the Y-axis direction while reciprocating the active incident region 2 in the X-axis direction. Consequently, the distance that the incident region 2 travels can be shortened, for example, as compared to the case where the region is moved in the Y-axis direction while being moved in one direction along the X-axis as shown in FIG. 3.

In the illustrated example, the controller 30 moves the active incident region 2 in the +Y-axis direction while reciprocating the region in the X-axis direction and then moves the region in the −Y-axis direction while reciprocating the region in the X-axis direction. Consequently, CBED patterns detected first and last, respectively, can be placed adjacent to each other. Furthermore, the distance that the active incident region 2 moves can be reduced.

In the electron microscope associated with the fifth modification, the controller 30 controls the electron deflector 24 such that CBED patterns detected first and last, respectively, out of plural CBED patterns recorded as one image in the imager 28 are adjacent to each other. Therefore, in the electron microscope associated with the fifth modification, if the process for recording plural CBED patterns as one image is repeatedly performed, the time taken to return the active incident region 2 from the final position B to the initial position A can be shortened. Hence, in a case where the process for recording plural CBED patterns as one image is repetitively carried out, the recording time can be shortened.

(6) Sixth Modification

Figure 14:
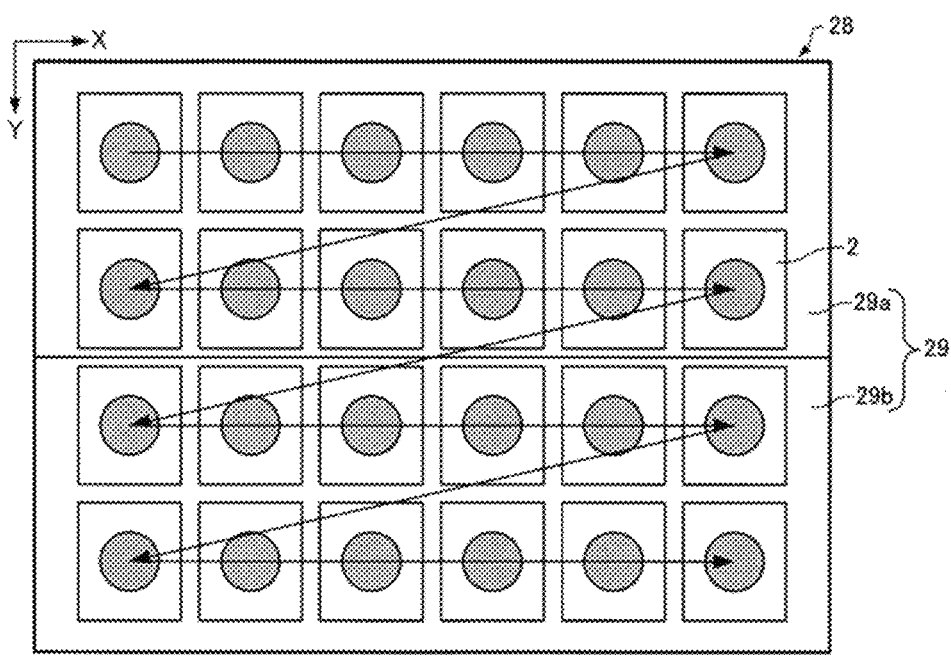
FIG. 14 is a schematic representation of the photosensitive surface of an imager included in an electron microscope associated with a sixth modification of the first embodiment.

An electron microscope associated with a sixth modification is next described. FIG. 14 schematically shows the photosensitive surface 29 of the imager 28 in the electron microscope associated with the sixth modification.

In the above-described electron microscope 100, as shown in FIG. 3, the imager 28 has one photosensitive surface 29, and plural CBED patterns detected by the single photosensitive surface 29 are recorded as one image.

On the other hand, in the electron microscope associated with the sixth modification, the photosensitive surface 29 of the imager 28 is split into photosensitive surface parts 29a and 29b. The imager 28 records plural detected CBED patterns as one image for each of the photosensitive surface parts 29a and 29b. Therefore, readout can be performed from the two photosensitive surface parts 29a and 29b alternately. Consequently, while detection is being done by one photosensitive surface part 29a, readout can be done from the other photosensitive surface part 29b.

In the present modification, the photosensitive surface 29 of the imager 28 is split into the first photosensitive surface part 29a and second photosensitive surface part 29b. Plural CBED patterns are detected by the first photosensitive surface part 29a and recorded as one image. Similarly, plural CBED patterns are detected by the second photosensitive surface part 29b and recorded as one image.

In the imager 28, CBED patterns can be read out from the second photosensitive surface part 29b while CBED patterns are being detected by the first photosensitive surface part 29a. Furthermore, in the imager 28, CBED patterns can be read out from the first photosensitive surface part 29a while CBED patterns are being detected by the second photosensitive surface part 29b.

In the example given here, the photosensitive surface 29 of the imager 28 is divided into two parts. No restriction is imposed on the number of division. The photosensitive surface 29 may be divided into three or more parts.

In the electron microscope associated with the sixth modification, the photosensitive surface 29 of the imager 28 is split into plural photosensitive surface parts. The imager 28 records plural detected CBED patterns as one image for each of the photosensitive surface parts 29a and 29b. Therefore, as described previously, while CBED patterns are being detected by one photosensitive surface part 29a, readout of CBED patterns can be done from the other photosensitive surface part 29b. In consequence, the recording time can be shortened.

2. Second Embodiment 2.1. Configuration of Electron Microscope

Figure 15:
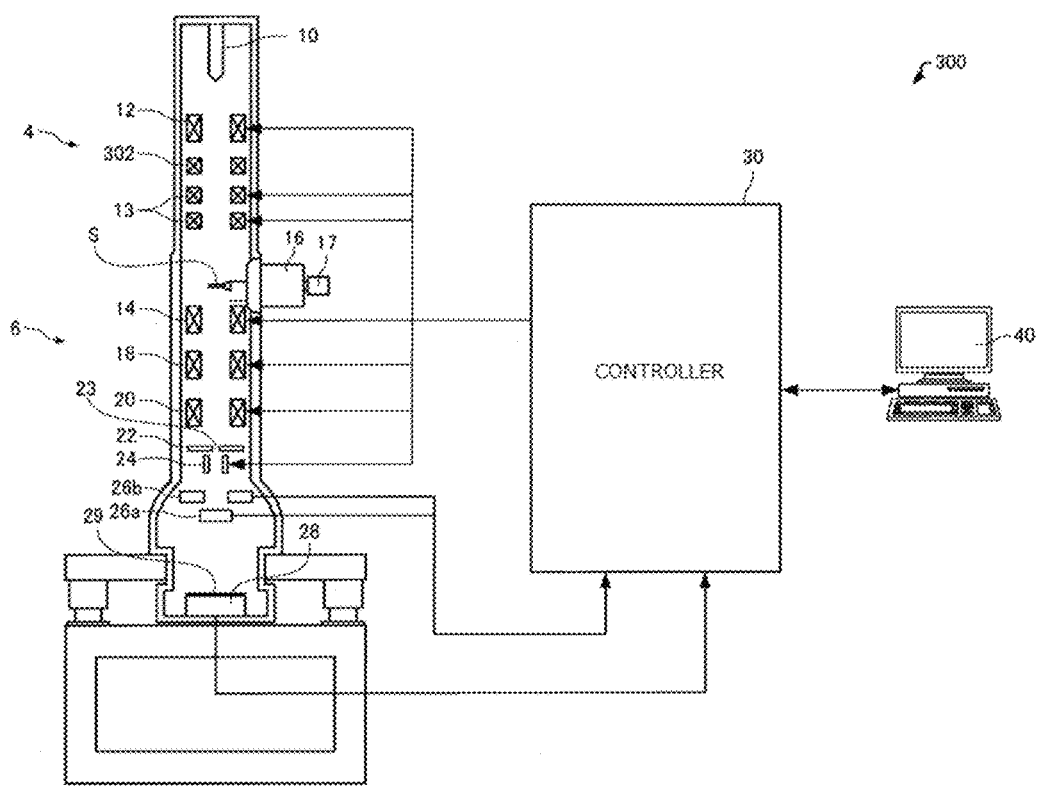
FIG. 15 is a schematic vertical cross section similar to FIG. 1, but showing an electron microscope associated with a second embodiment.

An electron microscope associated with a second embodiment is next described by referring to FIG. 15, which schematically shows the electron microscope, 300, associated with the second embodiment. Those members of the electron microscope 300 which are similar in function to their respective counterparts of the electron microscope 100 associated with the first embodiment are indicated by the same reference numerals as in the above referenced figures and a detailed description thereof is omitted.

In the above-described electron microscope 100, plural CBED patterns having a one-to-one correspondence with positions on the sample S are obtained by positionally scanning the electron beam impinging on the sample S.

On the other hand, in the electron microscope 300, the electron beam impinging on the sample S is angularly scanned (i.e., by varying the angle of incidence of the electron beam relative to the sample S), and plural transmission images of the sample S which have a one-to-one correspondence with angles of incidence of the electron beam relative to the sample S are obtained.

As shown in FIG. 15, the electron microscope 300 is configured including a deflector 302 (which is one example of angular scanner) for angularly scanning the electron beam impinging on the sample S. The deflector 302 is incorporated in the illumination system 4 of the electron microscope 300. The deflector 302 deflects the electron beam which is made to impinge on the sample S. The deflector 302 may be an electrostatic deflector or an electromagnetic deflector.

2.2. Operation of Electron Microscope

The operation of the electron microscope 300 is next described. The processing of the electron microscope 300 to obtain plural transmission images having a one-to-one correspondence with angles of incidence of the electron beam relative to the sample S is described below.

Figure 16:
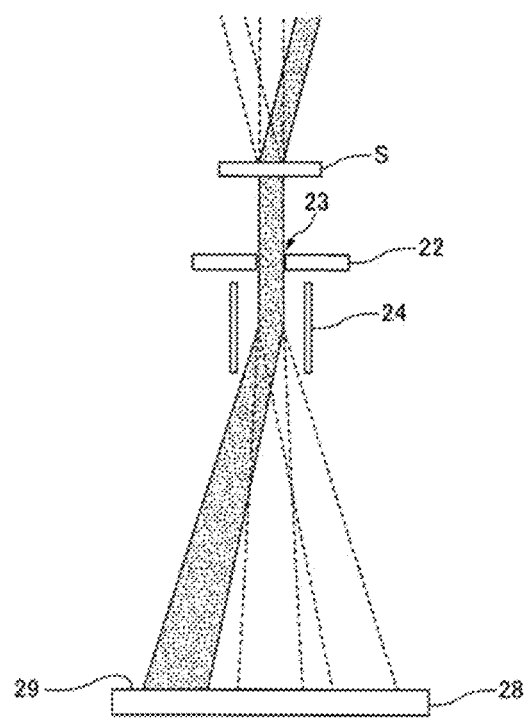
FIG. 16 is an electron ray diagram illustrating the operation of the electron microscope of FIG. 15.

FIG. 16 illustrates the operation of the electron microscope 300. In FIG. 16, members other than the mask 22, electron deflector 24, and imager 28 are omitted from being shown.

In the electron microscope 300, the electron beam emitted from the electron source 10 is collimated or substantially collimated by the condenser lens system 12 and made to impinge on the sample S. Electrons transmitted through the sample S are detected by the photosensitive surface 29 of the imager 28 via the objective lens 14, intermediate lens 18, and projector lens 20.

The electrons transmitted through the sample S form a transmission image at the image plane of the objective lens 14. This transmission image formed at the image plane of the objective lens 14 is magnified by the intermediate lens 18 and projector lens 20 and focused onto the photosensitive surface 29 of the imager 28. Therefore, the imager 28 can record the transmission image.

In the electron microscope 300, the electron beam is angularly scanned by the deflector 302 while maintaining the hit position on the sample S unchanged, and plural transmission images having a one-to-one correspondence with angles of incidence of the electron beam relative to the sample S are recorded.

In the electron microscope 300, the controller 30 controls the electron deflector 24 such that the active electron incident region 2 of the photosensitive surface 29 of the imager 28 is varied in response to angular scanning of the electron beam hitting the sample S. Consequently, in the imager 28, plural transmission images having a one-to-one correspondence with angles of incidence of the electron beam relative to the sample S can be recorded as one image. Hence, the recording time can be shortened.

In particular, electrons transmitted through the mask 22 are deflected by the electron deflector 24 as shown in FIG. 16. The controller 30 controls the electron deflector 24 such that the active electron incident region 2 of the photosensitive surface 29 is varied in response to angular scanning of the electron beam impinging on the sample S (i.e., in response to variation of the angle of incidence of the electron beam relative to the surface of the sample S). As a result, the electrons transmitted through the mask 22 enter the different incident regions 2 in response to different angles of incidence of the electron beam. Thus, transmission images having magnitudes corresponding to the angles of incidence are formed in the incident regions 2. In consequence, the plural transmission images are detected at the photosensitive surface 29 of the imager 28.

The plural transmission images detected by the photosensitive surface 29 are recorded as one image by the imager 28. That is, the plural transmission images detected at the photosensitive surface 29 are read out at once from the imager 28.

Image data about images including the plural transmission images recorded by the imager 28 is furnished to the PC 40 via the controller 30. The PC 40 extracts the plural transmission images from the image data and brings the obtained transmission images into a one-to-one correspondence with the angles of incidence of the electron beam. As a result, it is possible to obtain the plural transmission images having a one-to-one correspondence with the angles of incidence of the electron beam relative to the sample S.

The PC 40 generates a rocking pattern (electron channeling pattern) from the intensities of the plural transmission images bearing a one-to-one correspondence with the angles of incidence of the electron beam relative to the sample S. Specifically, a bright-field rocking pattern can be generated by selecting direct spots using the objective lens aperture and then obtaining information about an angular distribution of the intensities at positions selected by the objective lens aperture from plural transmission images. Furthermore, dark-field rocking patterns can be generated by producing diffraction spots corresponding to diffracted waves by electron diffraction, selecting desired ones of the diffraction spots using the objective lens aperture, and then obtaining information about an angular distribution of the intensities at positions selected by the objective lens aperture from plural images. In this way, in the present embodiment, a rocking pattern of a sample can be captured in a two-dimensional manner in one measurement.

The electron microscope 300 associated with the second embodiment includes the electron deflector 24 for deflecting electrons transmitted through the sample S. The controller 30 controls the electron deflector 24 such that the active electron incident region 2 of the photosensitive surface 29 of the imager 28 is varied in response to angular scanning of the electron beam impinging on the sample S. Therefore, plural transmission images having a one-to-one correspondence with angles of incidence of the beam relative to the sample S can be recorded as one image by the imager 28. Accordingly, when the plural transmission images having a one-to-one correspondence with the angles of incidence of the beam relative to the sample S are recorded, the recording time can be shortened, for example, as compared with the case where a recording is made whenever a transmission image is obtained after a modification of the incident angle.

An image acquisition method associated with the second embodiment involves deflecting electrons transmitted through the sample S such that the active electron incident region 2 of the photosensitive surface 29 of the imager 28 is varied in response to angular scanning of the electron beam impinging on the sample S. Therefore, plural transmission images having a one-to-one correspondence with the angles of incidence of the beam relative to the sample S can be recorded as one image in the imager 28. Consequently, the recording time can be shortened.

The above-described modifications of the first embodiment are also applicable to the second embodiment.

3. Other Respects

It is to be understood that the present invention is not restricted to the above embodiments and that the invention can be practiced in variously modified forms without departing from the gist of the invention.

For example, in the above-described first embodiment, the electron deflector 24 is controlled such that the active electron incident region 2 of the photosensitive surface 29 of the imager 28 is varied in response to positional scanning of the electron beam. That is, in the first embodiment, the position on the sample S hit by the electron beam is varied to vary the illumination conditions of the illumination system 4 of the electron microscope 100.

Also, in the above-described second embodiment, the electron deflector 24 is controlled so that the active electron incident region 2 of the photosensitive surface 29 of the imager 28 is varied in response to angular scanning of the electron beam. That is, in the second embodiment, the angle of incidence of the electron beam relative to the sample S is varied to vary the illumination conditions of the illumination system 4 of the electron microscope 300.

It is to be noted that in the present invention, variations in the electron beam illumination conditions are not restricted to variations in the hit position and in the angle of incidence. They may also be variations in the operating conditions of various optical elements incorporated in the illumination system 4. That is, in the electron microscope associated with the present invention, when plural images (diffraction patterns) are obtained in response to variations in the illumination conditions of the illumination system 4, the controller 30 controls the electron deflector 24 such that the active electron incident region 2 of the photosensitive surface 29 of the imager 28 is varied in response to the variations in the illumination conditions of the illumination system 4. Consequently, the recording time taken to record the plural images (diffraction patterns) can be shortened.

Furthermore, in the first embodiment described above, the controller 30 moves the active incident region 2 in the order as indicated by the arrows in FIG. 3. In the electron microscope associated with the fifth modification, the controller 30 moves the active incident region 2 in the order as indicated by the arrows in FIG. 13. In the present invention, the order in which the active incident region 2 is moved is not restricted to these examples.

Figure 17:
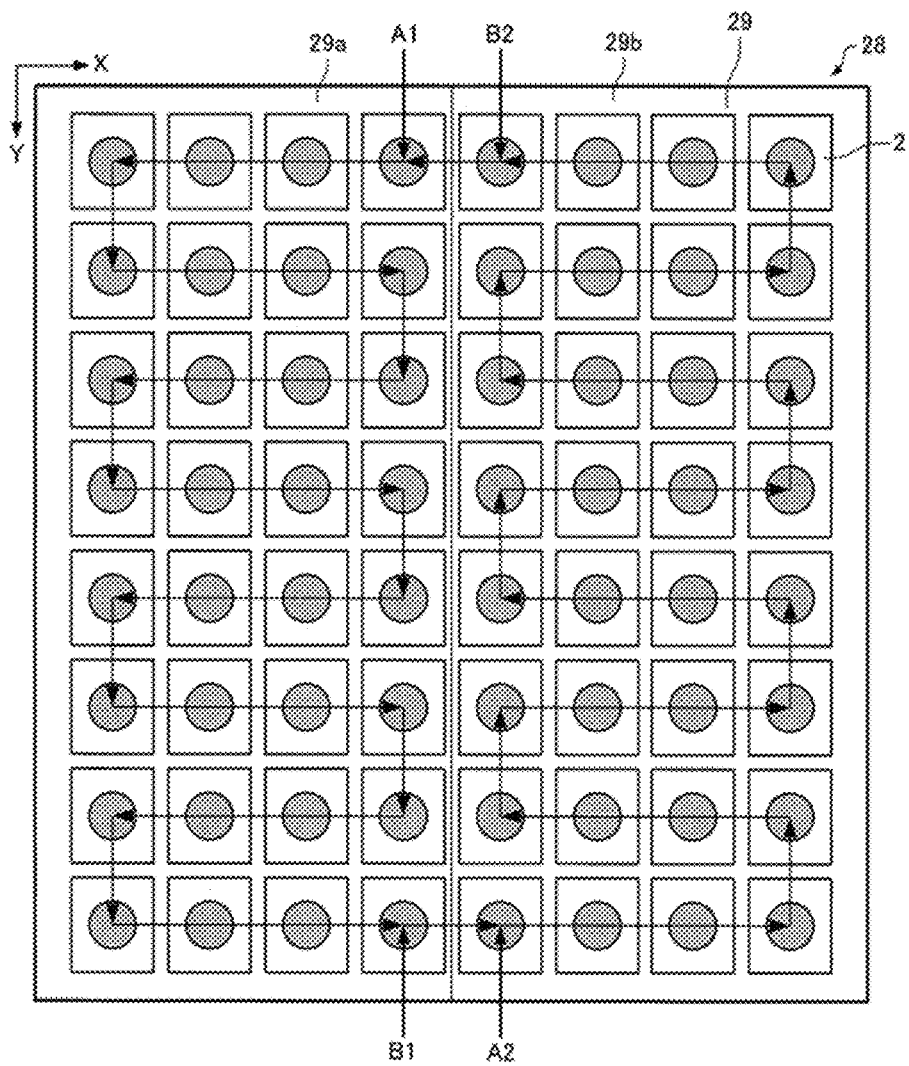
FIGS. 17-20 are diagrams illustrating the order in which the active electron incident region of the electron microscope of FIG. 15 is moved.

For example, as shown in FIG. 17, in a case where the photosensitive surface 29 of the imager 28 is split into the two photosensitive surface parts 29a and 29b, the controller 30 may control the electron deflector 24 such that the CBED pattern detected last by the first photosensitive surface part 29a of the imager 28 and the CBED pattern detected first by the second photosensitive surface part 29b are adjacent to each other. This can reduce the time taken to move the active incident region 2 from the final position B1 of the first photosensitive surface part 29a to the initial position A2 of the second photosensitive surface part 29b.

Furthermore, the controller 30 may control the electron deflector 24 in such a way that the CBED pattern detected last by the second photosensitive surface part 29b of the imager 28 and the CBED pattern detected first by the first photosensitive surface part 29a are adjacent to each other. This can shorten the time taken to move the active incident region 2 from the final position B2 of the second photosensitive surface part 29b to the initial position A1 of the first photosensitive surface part 29a.

As shown in FIG. 17, where the incident regions 2 in each of the photosensitive surface parts 29a and 29b are arranged in an even number of rows and an even number of columns, the controller 30 may move the active incident region 2 in the order as indicated by the arrows in FIG. 17. Where the incident regions 2 in each of the photosensitive surface parts 29a and 29b are arranged in an even number of rows and an odd number of columns for example, as shown in FIG. 18, the controller 30 may move the active incident region 2 in the order as indicated by the arrows in FIG. 18.

Figure 19:
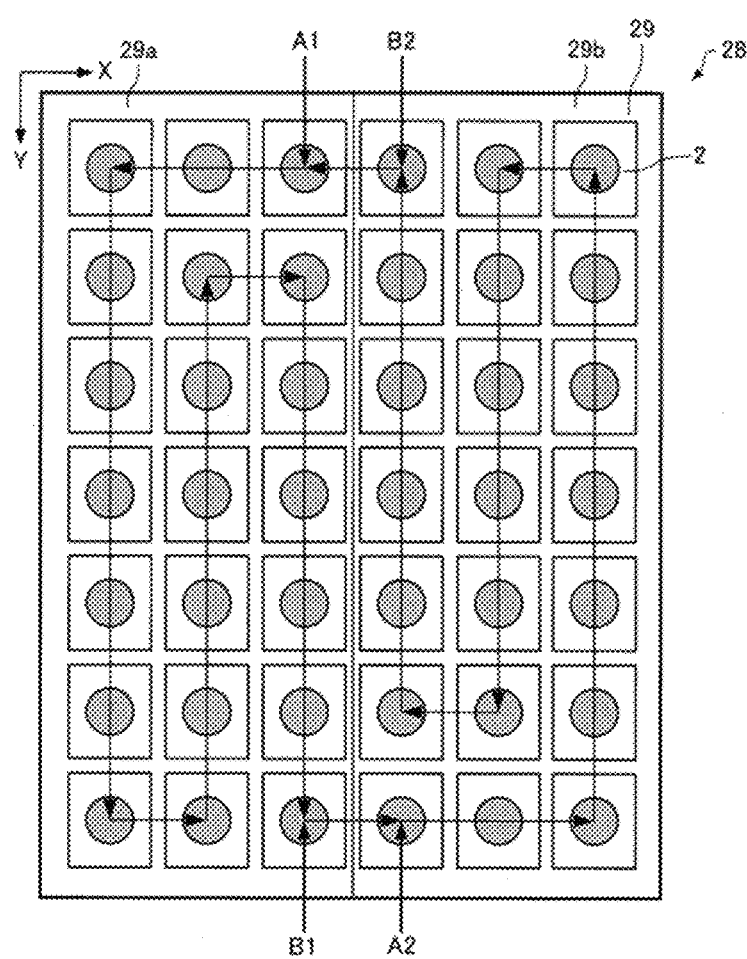
Figure 20:
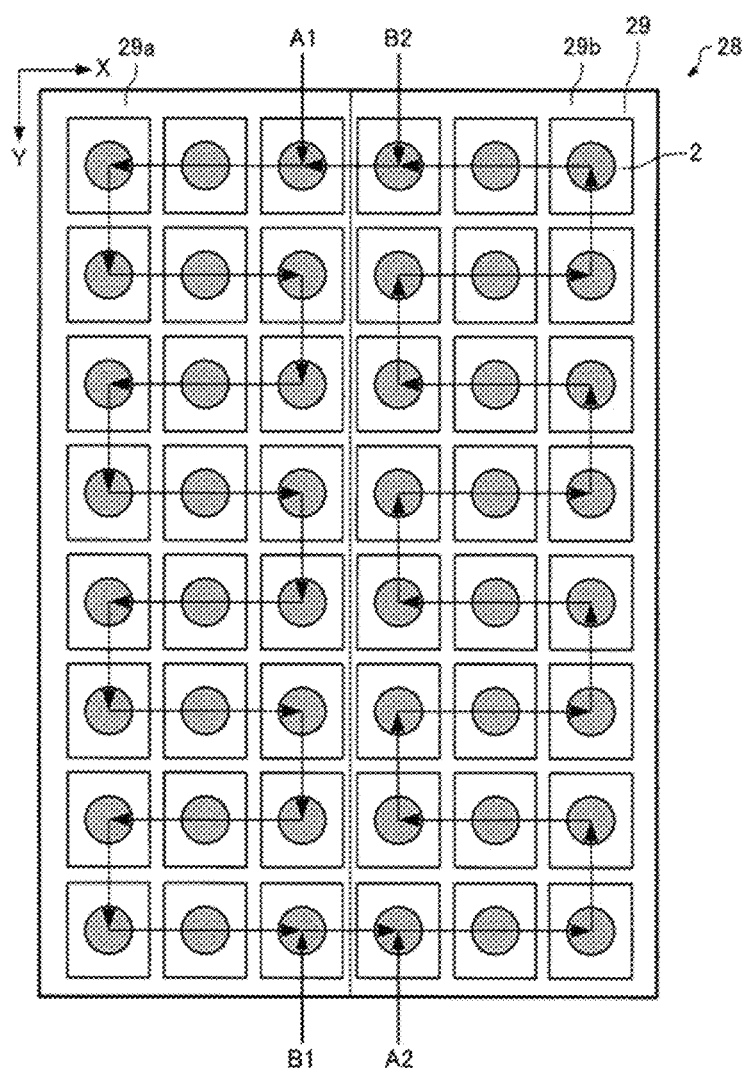

In addition, where the incident regions 2 in each of the photosensitive surface parts 29a and 29b are arranged in an even number of rows and an even number of columns, for example, as shown in FIG. 19, the active incident region 2 may be moved in the order as indicated by the arrows in FIG. 19. Where the incident regions 2 in each of the photosensitive surface parts 29a and 29b are arranged in an even number of rows and an even number of columns, for example, as shown in FIG. 20, the active incident region 2 may be moved in the order as indicated by the arrows in FIG. 20.

Figure 18:
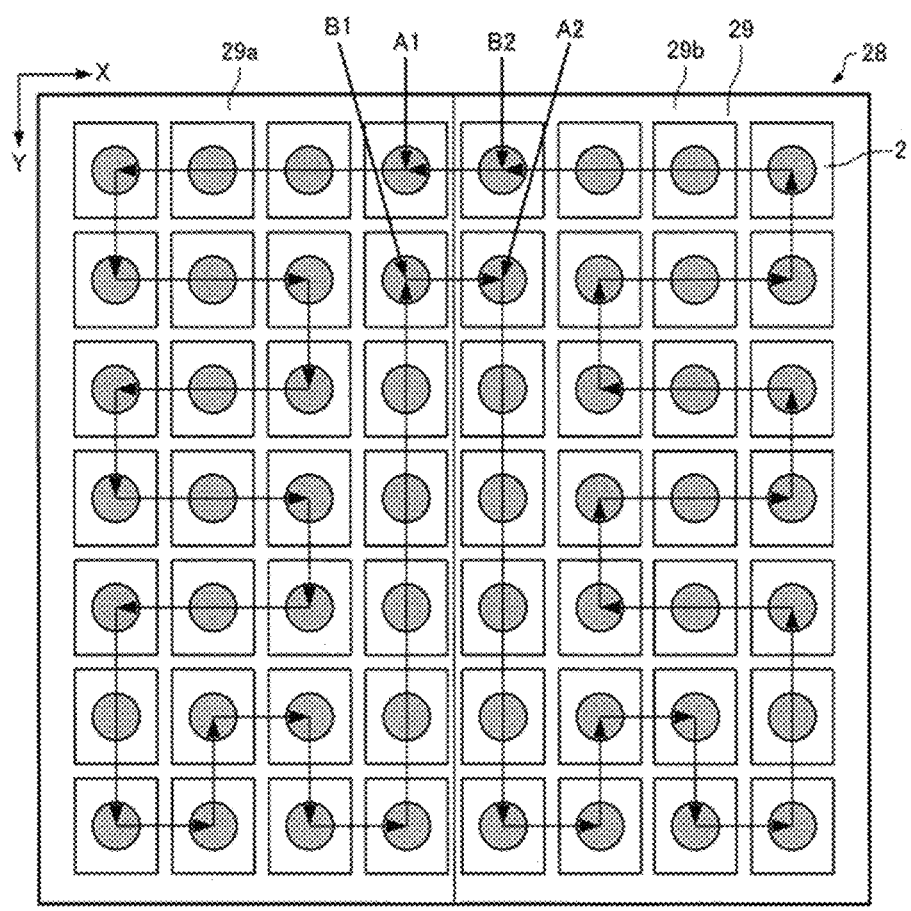

Even in the examples shown in FIGS. 18 and 19, it is possible to shorten the time taken to move the active incident region 2 from the final position B1 of the first photosensitive surface part 29a to the initial position A2 of the second photosensitive surface part 29b. Also, it is possible to shorten the time taken to move the active incident region 2 from the final position B2 of the second photosensitive surface part 29b to the initial position A1 of the first photosensitive surface part 29a.

In the above examples, the photosensitive surface 29 of the imager 28 is divided into two. The active incident region 2 can be similarly moved in a case where the number of division is four.

In this electron microscope, while image detection is being performed by one photosensitive surface part 29a, image readout can be done from the other photosensitive surface part 29b. Therefore, where the process of recording plural images as one image is repeated at each of the photosensitive surface parts 29a and 29b, the time taken to return the active incident region 2 from the position of the incident region 2 where a finally detected image is formed to the position of the incident region 2 where an initially detected image is formed can be shortened for each of the photosensitive surface parts 29a and 29b. Thus, the distance that the active incident region 2 must move in going from one of the photosensitive surface parts to the other can be shortened. Hence, the recording time can be shortened.

It is to be noted that the above embodiments and modifications are merely exemplary and that the invention is not restricted thereto. For example, the embodiments and modifications may be combined appropriately.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

The invention claimed is:

1. An electron microscope comprising:
    an illumination system illuminating a sample with an electron beam;
    an imaging system focusing electrons transmitted through the sample;
    an electron deflector deflecting the electrons transmitted through the sample;
    an imager which has a photosensitive surface detecting the electrons transmitted through the sample and which records focused images formed by the electrons transmitted through the sample;

a controller controlling the electron deflector such that an active electron incident region of the photosensitive surface currently hit by the beam is varied in response to variations in illumination conditions of the illumination system; and an active incident region defining portion defining the shape and size of said active electron incident region, wherein said active incident region defining portion is a mask having at least one opening corresponding in shape and size to said active electron incident region, wherein said electron deflector deflects electrons passed through the opening, and a moving mechanism moving said mask, wherein the mask has said at least one opening which is plural in number and mutually different in size.

2. The electron microscope as set forth in claim 1, wherein said illumination system includes a positional scanner scanning the position on the sample hit by the impinging electron beam, and wherein said variations in said illumination conditions are variations in the hit position.

3. The electron microscope as set forth in claim 1, wherein said illumination system includes an angular scanner scanning the angle of incidence of the impinging electron beam relative to the sample, and wherein the variations in said illumination conditions are variations in said angle of incidence.

4. The electron microscope as set forth in claim 1, further comprising an optical system which is disposed in a stage following said mask and which is used to control the size of said active electron incident region.

5. The electron microscope as set forth in claim 1, wherein said electron deflector is made up of plural deflector units arranged along an optical axis.

6. The electron microscope as set forth in claim 1, wherein said photosensitive surface is divided into plural photosensitive surface parts, and wherein said imager records plural detected images as one image for each of the photosensitive surface parts.

7. The electron microscope as set forth in claim 1, wherein said illumination system includes an electron beam blanker blanking the electron beam, and wherein said controller controls the electron beam blanker to prevent the electron beam from hitting the sample while the electron deflector is varying said active electron incident region.

* * * * *